United States Patent [19]
Jones et al.

[11] Patent Number: 5,298,285
[45] Date of Patent: Mar. 29, 1994

[54] METHOD OF PRODUCING A TOOL COMPONENT

[76] Inventors: Barbara L. Jones, 80 Chisbury Close, Forest Park, Bracknell, RG12 3TX; Timothy J. Valentine, Pear Tree House, Folly Hill, Farnham, Surrey, GU9 0BD, both of England

[21] Appl. No.: 896,157

[22] Filed: Jun. 10, 1992

[30] Foreign Application Priority Data

Jun. 10, 1991 [GB] United Kingdom ............... 9112408

[51] Int. Cl.$^5$ ............... C23C 16/26; C04B 35/56; B24D 17/00
[52] U.S. Cl. ............... 427/249; 427/255; 156/DIG. 68; 428/408; 501/87; 51/293
[58] Field of Search ............... 427/249, 255; 156/DIG. 68; 428/408; 423/446; 501/81, 87; 51/293

[56] References Cited

U.S. PATENT DOCUMENTS

| | | | |
|---|---|---|---|
| 3,850,053 | 11/1974 | Bovenkerk | 76/101 R |
| 4,334,928 | 6/1982 | Hara et al. | 75/238 |
| 4,380,471 | 4/1983 | Lee et al. | 419/11 |
| 4,789,385 | 12/1988 | Dryer et al. | 51/293 |

*Primary Examiner*—Shrive Beck
*Assistant Examiner*—Bret Chen
*Attorney, Agent, or Firm*—Scully, Scott, Murphy & Presser

[57] ABSTRACT

A method is provided for producing a tool component which comprises a CVD diamond layer bonded to a cemented carbide substrate. The method includes the steps of providing a mass of carbide particles bonded into a layer with an organic binder, removing the organic binder to produce a porous mass of the particles, depositing a layer of diamond by CVD on a surface of the porous mass, placing the porous mass in contact with a layer of binder metal particles bonded with an organic binder, and heating the product to allow the metal binder particles to melt and infiltrate the carbide particles and produce a cemented carbide substrate for the CVD diamond layer.

8 Claims, 1 Drawing Sheet

METHOD OF PRODUCING A TOOL COMPONENT

BACKGROUND OF THE INVENTION

This invention relates to tool components.

It has been proposed in the literature to produce tool components by depositing a layer of diamond by chemical vapour deposition (CVD) on a surface of a cemented carbide substrate. One of the difficulties which such a method gives rise to is the achievement of a strong bond between the CVD diamond layer and the substrate.

Chemical vapour deposition of diamond involves the synthesis of diamond from the gas phase. The process generally involves providing a mixture of hydrogen or oxygen gas and a suitable gaseous carbon compound such as a hydrocarbon, applying sufficient energy to that gas to dissociate the hydrogen or oxygen into atomic hydrogen or oxygen and the gas into active carbon ions, atoms or CH radicals, and allowing such active species to deposit as diamond on a substrate. Dissociation of the gases can take place by a variety of methods. These methods include the use of a hot filament, a plasma assisted method using microwave, RF or DC plasma, or the use of a plasma jet.

SUMMARY OF THE INVENTION

According to the present invention, there is provided a method of producing a tool component comprising a CVD diamond layer bonded to a cemented carbide substrate which comprises a mass of carbide particles and a metal binder, the method including the steps of:
  (i) providing a porous, bonded mass of carbide particles;
  (ii) depositing a layer of diamond by CVD on a surface of the porous mass;
  (iii) placing the porous mass in contact with a mass of the binder metal; and
  (iv) heating the product of step (iii) to an elevated temperature to allow the metal binder to melt and infiltrate the carbide particles and produce a cemented carbide substrate for the CVD diamond layer.

BRIEF DESCRIPTION OF THE DRAWINGS

The drawings illustrate schematically the steps involved in the two embodiments of the invention.

DESCRIPTION OF EMBODIMENTS

Figure 1:
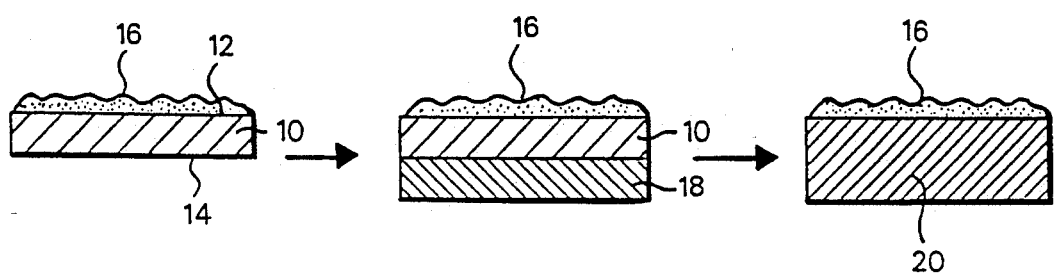
Figure 2:
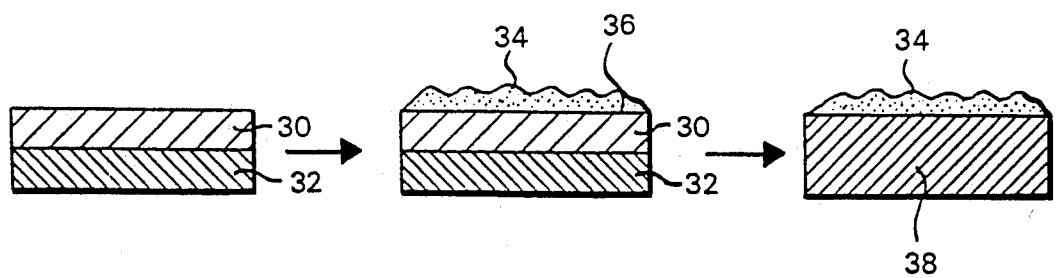

The tool insert which is produced by the method of the invention comprises a CVD diamond layer bonded to a cemented carbide substrate. In the method, the cemented carbide substrate is produced in situ and this, it has been found, allows for an excellent bond between the carbide and the CVD diamond to be produced.

Preferably, the porous, bonded mass of carbide particles is produced by providing a mass of carbide particles in bonded form with an organic binder and then removing the organic binder.

The mass of the binder metal in step (iii) may be in particulate or shim form. When it is in particulate form, it is preferably provided in bonded form with an organic binder which is removed prior to step (iv). The resulting mass will also be a porous mass.

The organic binder will typically be a highly viscous organic bonding agent which will volatilise at a temperature of about 350° C. or higher. An example of such a bonding agent is a cellulose ether. Generally, such organic binders will be removed by heating the bonded layer to a temperature in the range of 475° to 700° C. Such heating can be achieved by any of the variety of methods such as low pressure hydrogen plasma, inductive vacuum heating or the like.

The heating in step (iv) will be such as to cause the metal binder particles to melt. Generally, temperatures in excess of 1000° C. will be required and under such conditions the heating should take place in a vacuum or a non-oxidising atmosphere to avoid damage occurring to the CVD diamond layer. Typically, the elevated temperature required to cause the binder metal to infiltrate the carbide particles will be maintained for a period of 10 to 40 minutes.

The cemented carbide may be any known in the art. Typically, the carbide particles will be tungsten, titanium, tantalum or chromium carbide particles and the binder metal will be nickel, cobalt or iron or alloys containing one or more of these metals.

Two embodiments of the invention will now be described with reference to the accompanying drawings. Referring first to method 1, a carbide particle based paper 10 is pre-cut to a desired shape. The paper has major surfaces 12 and 14 on opposite sides thereof. The paper comprises a mass of carbide particles such as tungsten carbide or chromium carbide held in a coherent form by an organic binder. The organic binder will typically be a highly viscous organic bonding agent which will volatilise at a temperature of about 350° C. or higher.

The carbide paper 10 is heated to a temperature in the range 475° to 700° C. to cause the organic binder to volatilise, leaving a layer which is porous.

A layer 16 of CVD diamond is then deposited on the major surface 12. This layer may be deposited by any of the known CVD methods. Such deposition will take place at a temperature in the range 600° to 800° C. in a vacuum.

Thereafter, the composite 10, 16 is placed on a layer 18 consisting of a mass of binder metal particles bonded with an organic binder of the type described above. The unbonded assembly is then subjected to an elevated temperature, generally higher than 1100° C., in a vacuum or non-oxidising atmosphere for a period of time to allow the binder metal to melt, the organic binder to volatilise and the binder metal to infiltrate the carbide particles and form a cemented carbide. The resulting product is a tool component comprising a CVD diamond layer 16 bonded to a cemented carbide substrate 20.

By way of example, the organic binder in the carbide based paper 10 may be volatilised by low pressure hydrogen plasma using the following conditions:

Hydrogen flow—80 sccm
Pressure—$26 \times 10^2$ to $80 \times 10^2$ Pa
Power—350 W
Time—10 to 45 minutes
Temperature of carbide paper—470° to 690° C.

The diamond layer 16 may be deposited on the surface 12 by plasma chemical vapour deposition using the following conditions:

Hydrogen flow—80 sccm
Methane flow—0.85 sccm

Pressure—$65 \times 10^2$ Pa
Temperature of carbide paper—740° C.
Diamond deposition rate—about 0.3 microns per hour A second embodiment of the invention is illustrated by method 2 of the accompanying drawings. Referring to this method, a carbide paper 30 and metal binder paper 32, both as described above, are placed one on top of the other. The organic binder of the layers is caused to volatilise using the conditions described for the first embodiment leaving porous masses of the carbide particles and metal binder, respectively. A layer of CVD diamond 34 is then deposited on the surface 36 of the carbide paper 30. Thereafter, and while still under a non-oxidising atmosphere or a vacuum, the temperature is raised to the melting temperature of the binder metal to allow the binder metal to infiltrate the carbide particles and form a cemented carbide. The resulting product is again a tool component comprising a CVD diamond layer 34 bonded to a cemented carbide substrate 38.

The CVD diamond layer will typically have a thickness greater than 5 microns and preferably in the range 5 to 50 microns.

The carbide and binder metal papers may also include other particulate materials such as diamond or cubic boron nitride particles. When such other particulate materials are included they will typically be present in an amount of 5 to 50% by volume and have a particle size about the same as that of the carbide particles.

The tool components of the invention may be used as cutting tool inserts with the cemented carbide substrate providing a readily brazeable surface. Alternatively, a surface of the carbide substrate can be metallised and this metallised surface used to bond the insert to a steel, carbide or like post. The tool components may also be used as wear parts.

We claim:

1. A method of producing a tool component comprising a diamond layer bonded to a cemented carbide substrate which comprises a mass of carbide particles cemented with a metal binder, the method including the steps of:

(i) providing a porous, bonded mass of carbide particles;
   (ii) depositing a layer of diamond by chemical vapor deposition (CVD) on a surface of the porous mass;
   (iii) placing the porous mass in contact with a mass of binder metal; and
   (iv) heating the product of step (iii) to an elevated temperature which is effective to allow the metal binder to melt and infiltrate the carbide particles and produce a cemented carbide substrate for the CVD diamond layer.

2. A method according to claim 1 wherein the porous, bonded mass of carbide particles is produced by providing a mass of carbide particles in bonded form with an organic binder and removing the organic binder from said mass prior to depositing said layer of diamond.

3. A method according to claim 1 wherein the mass of the binder metal in step (iii), is in particulate, bonded form and further comprises an organic binder, and wherein said organic binder is removed from said mass of binder metal prior to the heating of step (iv).

4. A method according to claim 2 wherein the organic binder which is used to produce the porous, bonded mass of carbide particles is a material which volatilises at a temperature of about 350° C. or higher and said organic binder is removed from said mass of carbide particles by heating the bonded form to a temperature in the range of 475° to 700° C.

5. A method according to claim 1 wherein the porous, bonded mass of carbide particles is in the form of a layer having major surfaces on each of opposite sides thereof and the CVD diamond is deposited on one of these surfaces.

6. A method according to claim 1 wherein the carbide particles are selected from the group consisting of tungsten carbide, tantalum carbide, titanium carbide and chromium carbide particles.

7. A method according to claim 1 wherein the metal binder is selected from the group consisting of nickel, cobalt, iron and alloys containing one or more of these metals.

8. A method according to claim 1 wherein the elevated temperature in step (iv) is maintained for a period of 10 to 40 minutes.

* * * * *